(12) United States Patent
Pal et al.

(10) Patent No.: US 9,137,925 B2
(45) Date of Patent: Sep. 15, 2015

(54) HEAT SINK FOR CONTACTOR IN POWER DISTRIBUTION ASSEMBLY

(71) Applicant: HAMILTON SUNDSTRAND CORPORATION, Windsor Locks, CT (US)

(72) Inventors: Debabrata Pal, Hoffman Estates, IL (US); Aida Virginia Bennett, Cherry Valley, IL (US); John Shutts, Davis Junction, IL (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 309 days.

(21) Appl. No.: 13/889,677

(22) Filed: May 8, 2013

(65) Prior Publication Data

US 2014/0334074 A1 Nov. 13, 2014

(51) Int. Cl.
*H02B 1/56* (2006.01)
*H05K 7/20* (2006.01)
*H02B 1/056* (2006.01)

(52) U.S. Cl.
CPC ............. *H05K 7/20154* (2013.01); *H02B 1/56* (2013.01); *H02B 1/056* (2013.01)

(58) Field of Classification Search
CPC ................................ H02B 1/56; H05K 7/20154
See application file for complete search history.

(56) References Cited

U.S. PATENT DOCUMENTS

| | | | | |
|---|---|---|---|---|
| 3,241,605 A * | 3/1966 | Tabor | ........................... | 165/80.3 |
| 4,005,297 A * | 1/1977 | Cleaveland | .................... | 218/118 |
| 4,340,902 A * | 7/1982 | Honda et al. | .................. | 257/722 |
| 4,535,384 A * | 8/1985 | Wakabayashi et al. | ....... | 361/718 |
| 4,607,685 A * | 8/1986 | Mitchell, Jr. | ................. | 165/80.3 |
| D297,671 S * | 9/1988 | Groh | .............................. | D26/63 |
| 4,897,764 A * | 1/1990 | Bruchmann et al. | .......... | 361/705 |
| 5,256,902 A * | 10/1993 | Culver | ......................... | 257/722 |
| 5,929,410 A | 7/1999 | Mun | | |
| 6,018,455 A | 1/2000 | Wilke et al. | | |
| 6,510,047 B2 * | 1/2003 | Meiners et al. | ............... | 361/676 |
| 6,535,385 B2 * | 3/2003 | Lee | ................................ | 361/697 |
| 7,336,477 B2 * | 2/2008 | Weister et al. | ................ | 361/676 |
| 7,837,496 B1 * | 11/2010 | Pal | ................................. | 439/485 |
| 7,852,617 B2 * | 12/2010 | Lee | ................................ | 361/676 |
| D653,386 S * | 1/2012 | Rose | ........................... | D26/128 |
| 8,339,773 B2 * | 12/2012 | Frassineti et al. | ............. | 361/677 |
| 2002/0122289 A1 | 9/2002 | Mieners et al. | | |
| 2014/0002995 A1 * | 1/2014 | Pal | ................................ | 361/712 |
| 2014/0087584 A1 * | 3/2014 | Pal | ................................ | 439/485 |

FOREIGN PATENT DOCUMENTS

DE 19937072 A1 * 2/2001 ........... H02B 13/035

OTHER PUBLICATIONS

Extended EU Search Report for application 141673909.5, Mailed Sep. 10, 2014 U380126EP.

* cited by examiner

*Primary Examiner* — Robert J Hoffberg
(74) *Attorney, Agent, or Firm* — Cantor Colburn LLP

(57) ABSTRACT

An electrical contactor assembly is provided including an electrical contactor, an electrical bus bar, and a panel formed from an electrically insulating material. At least one post protrudes through the panel and is in contact with the electrical bus bar. The at least one post is constructed from an electrically and thermally conductive material. A first end of the at least one post is configured to electrically and thermally connect to the electrical contactor. A heat sink is removably coupled to a second end of the at least one post. The heat sink includes a body having a plurality of fins extending radially outward. A first portion of the plurality of fins extends around a circumference of the body. A second portion of the plurality of fins extends around only a portion of the circumference of the body.

13 Claims, 5 Drawing Sheets

HEAT SINK FOR CONTACTOR IN POWER DISTRIBUTION ASSEMBLY

BACKGROUND OF THE INVENTION

This invention generally relates to the field of electrical contactors and, more particularly, to a heat sink for dissipating heat generated by an electrical contactor connected to a mounting panel.

Contactor assemblies are used in electrical applications, such as aircraft power distribution systems, where power and current flow control of a multi-phase power distribution system is required. A contactor assembly typically has a panel on which several electrical contactors are mounted. Known mounting assemblies used to mount electrical contactors to the panels are constructed of thermally and electrically resistive materials, such as plastics or FR-4 for example.

Each of the contactors is connected to an electrical bus bar, and allows current to flow through the contactor and the corresponding bus bar whenever the contactor is in a closed position. The electrical power and current flow through the contactors is controlled by mechanically actuating a contact plate within the contactor such that, when current flow is desired to pass through the contactor, the contact plate is pushed into electrical contact with two leads and forms an electrical path coupling the leads, thereby allowing current to flow through it. Due to the amount of current traveling from the leads to the connector and the contact resistance at the contact points, waste heat is generated at the contact points and should be removed in order to prevent heat buildup. Additional factors such as imperfections in the contact surfaces or other imperfections can add to the amount of waste heat generated.

To dissipate the waste heat, previous known contactor mounting assemblies use thermally conductive electrical connections to allow the heat from the contact to be transmitted to the bus bars connected to each of the contactor's leads. The bus bars then dissipate heat into the atmosphere using natural convection and radiation techniques.

BRIEF DESCRIPTION OF THE INVENTION

According to one embodiment of the invention, an electrical contactor assembly is provided including an electrical contactor, an electrical bus bar, and a panel formed from an electrically insulating material. At least one post protrudes through the panel and is in contact with the electrical bus bar. At least one post is constructed from an electrically and thermally conductive material. A first end of the at least one post is configured to electrically and thermally connect to the electrical contactor. A heat sink is removably coupled to a second end of the at least one post. The heat sink includes a body having a plurality of fins extending radially outward. A first portion of the plurality of fins extends around a circumference of the body. A second portion of the plurality of fins extends around only a portion of the circumference of the body.

According to an alternate embodiment of the invention, an electrical panel box assembly is provided including a plurality of electrical contactors, a plurality of electrical bus bars, and a panel formed from an electrically insulating material. A plurality of posts protrudes through the panel and contacts the plurality of electrical bus bars. Each post is constructed from an electrically and thermally conductive material. A first end of each post is configured to electrically and thermally connect to the electrical contactor. A heat sink is removably coupled to a second end of at least one of the plurality of posts. The heat sink includes a body having a plurality of fins extending radially outward. A first portion of the plurality of fins extends around a circumference of the body. A second portion of the plurality of fins extends around only a portion of the circumference of the body.

BRIEF DESCRIPTION OF THE DRAWINGS

The subject matter, which is regarded as the invention, is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION OF THE INVENTION

Figure 1:
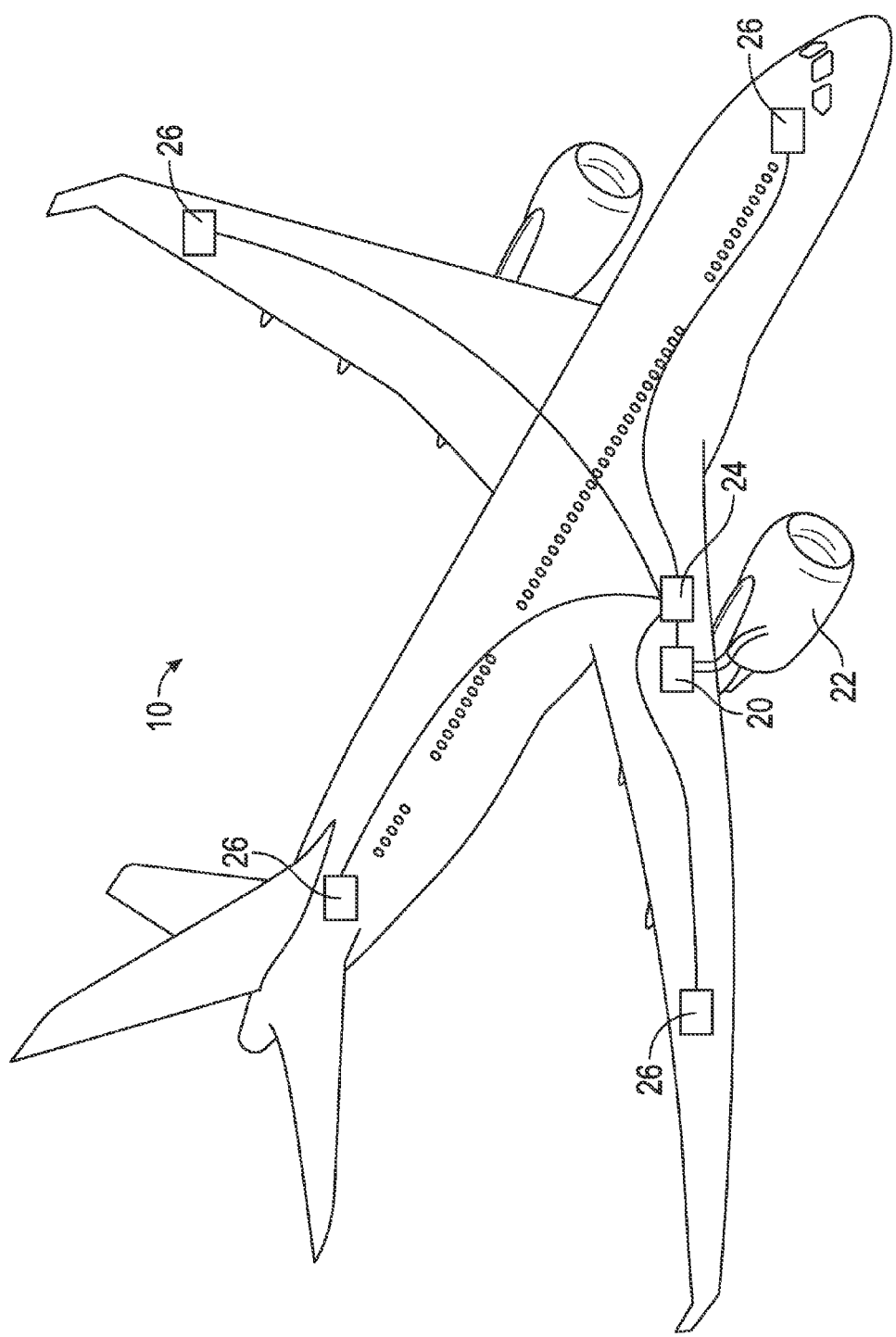
FIG. 1 is a schematic diagram of an aircraft.

Referring now to FIG. 1, an exemplary aircraft 10 including an electrical power distribution system is illustrated. The aircraft 10 includes a power generation system 20, which utilizes rotation within the jet engines 22 to generate either single phase or three phase electrical power. The power is sent to a panel box 24 that contains multiple electrical buses and contactor assemblies 100 for controlling how the power is distributed throughout the aircraft 10. Through the use of the electrical contactor assemblies 100, power may be controlled for each onboard electrical system 26 independently.

Figure 2:
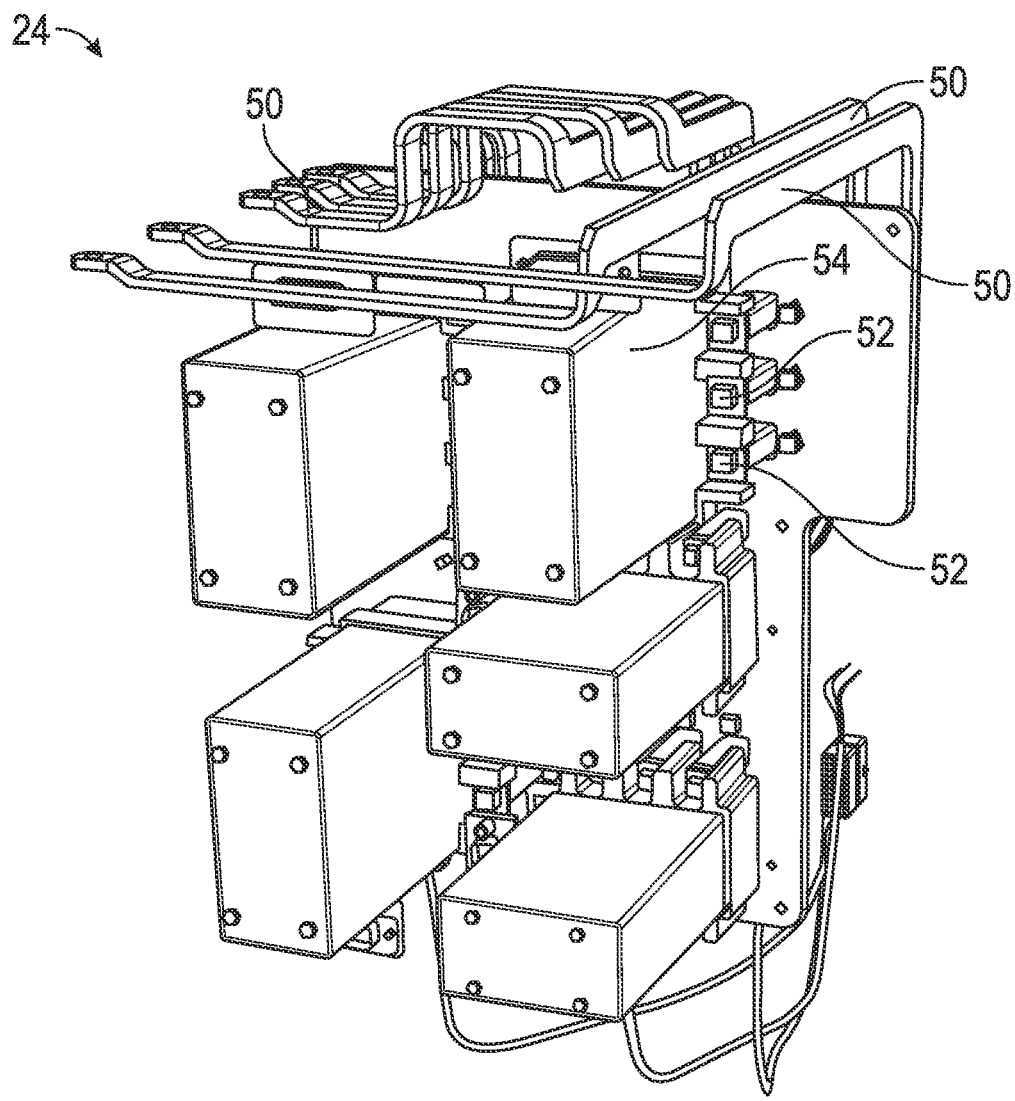
FIG. 2 is a schematic diagram of a portion of an exemplary power distribution network.

An example of the interior of a panel box 24 is illustrated in FIG. 2. The interior of the panel box 24 has multiple electrical bus bars 50, which are interrupted by electrical contactor connections 52. When the contactor connections 52 are closed, electrical current and heat are allowed to flow between the connected bus bars 50 and a contactor 54. In known systems, all of the excess heat generated in the contactors 54 is transmitted to the bus bars 50 for dissipation by radiation into the ambient atmosphere.

Figure 3:
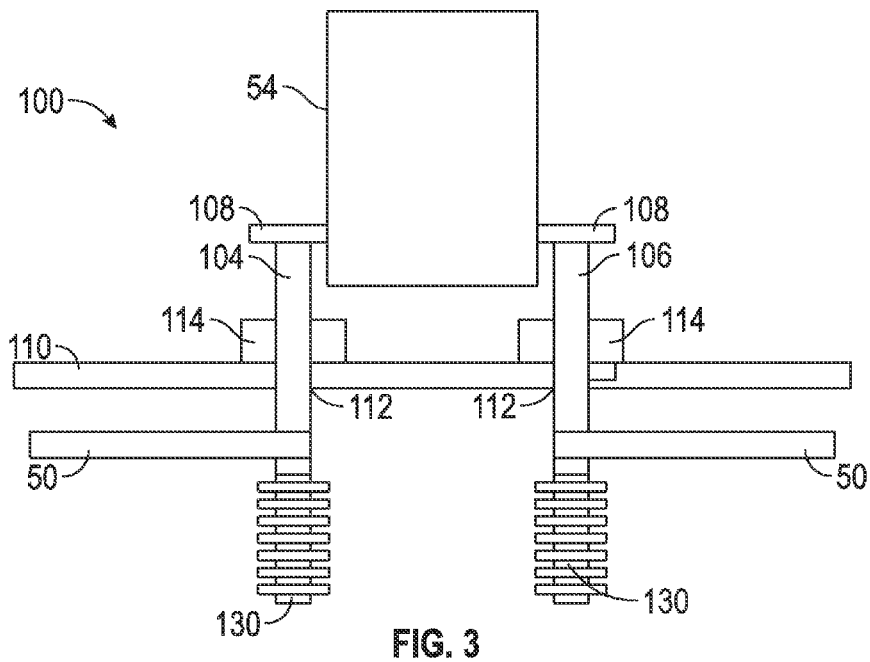
FIG. 3 is a cross-section of a contactor assembly in a power distribution network according to an embodiment.
Figure 4:
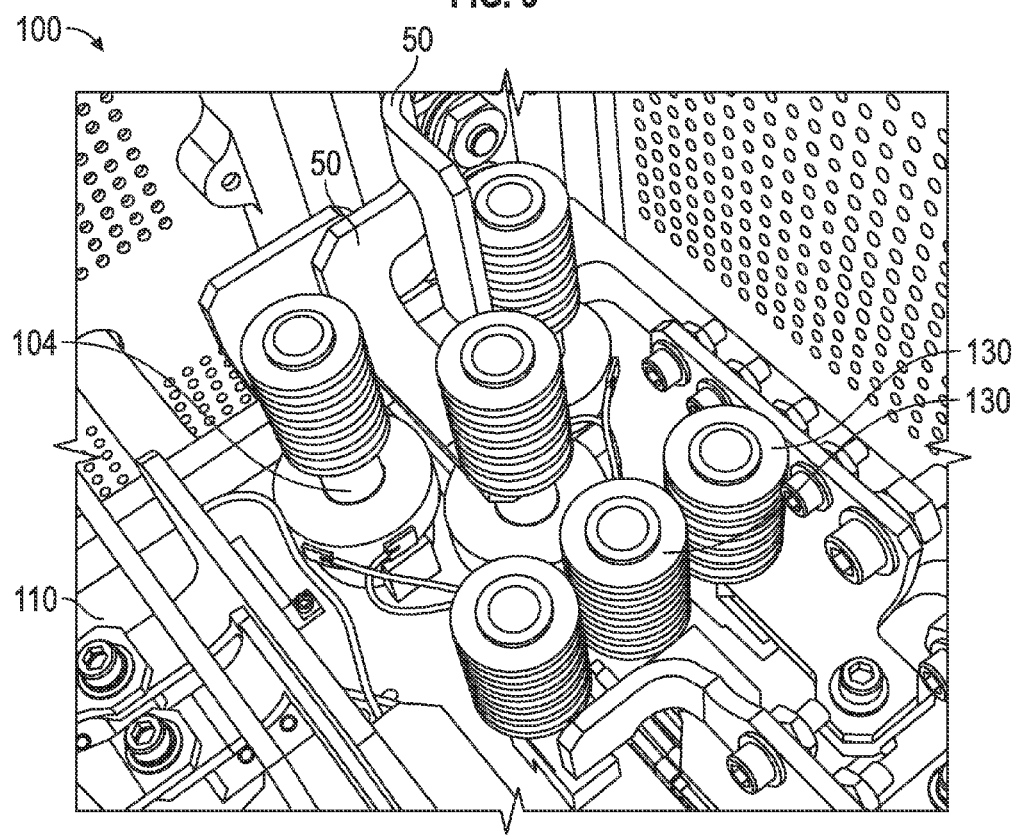
FIG. 4 is a perspective view of a contactor assembly in a power distribution network according to an embodiment.

Referring now to FIGS. 3 and 4, an example of a contactor assembly 100, for connecting an electrical contactor 54 to at least one bus bar 50, is illustrated. The contactor assembly 100 has at least one post 104 for connecting a contactor 54 to a first side of a bus bar 50 and at least one post 106 for connecting the contactor 54 to a second side of a bus bar 50. The electrical contactor 54 connects to the posts 104, 106 of the contactor assembly 100 via a set of electrical leads 108 using known thermal and electrical connection techniques. The posts 104, 106 are electrically and thermally coupled to the bus bars 50. The contactor assembly 100 additionally includes a panel 110 including multiple holes 112 through which the posts 104, 106 extend. In one embodiment, the posts 104, 106 are in direct contact with the panel 110. A structural support 114 is positioned at the interface between the posts 104, 106 and the panel 110 to mechanically fasten each post 104, 106 to the panel 110. In one embodiment, fasteners, such as screws for example, connect the structural support 114 to the panel 110.

A heat sink 130 is mounted to the end of at least one of the posts 104, 106 extending through both the panel 110 and the bus bar 50. The overall size, shape, and fin configuration of the heat sink 130 disclosed herein may be generally determined by the amount of heat to be dissipated.

Figure 6:
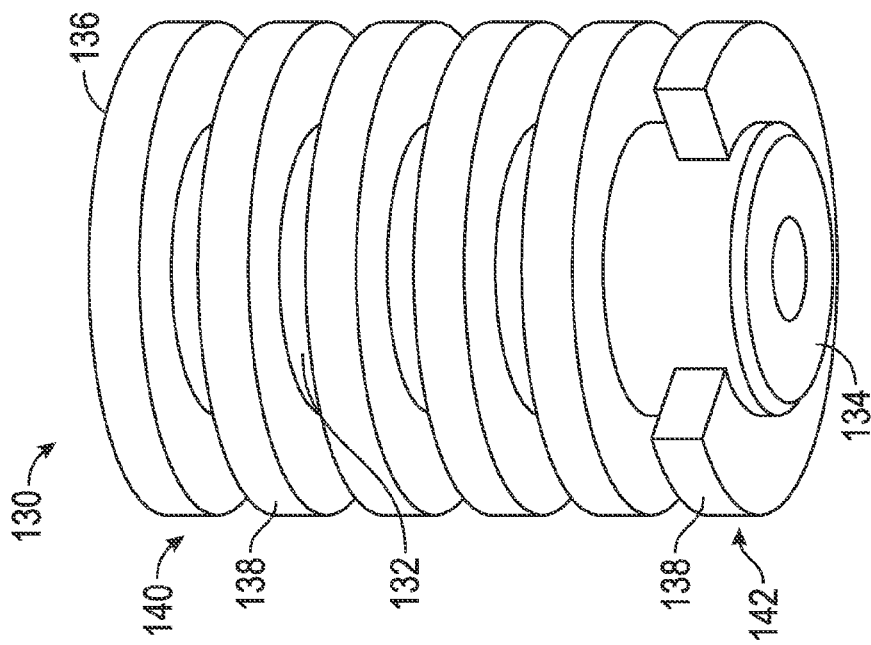
FIG. 6 is a perspective view of a heat sink of a contactor assembly according to another embodiment.
Figure 5:
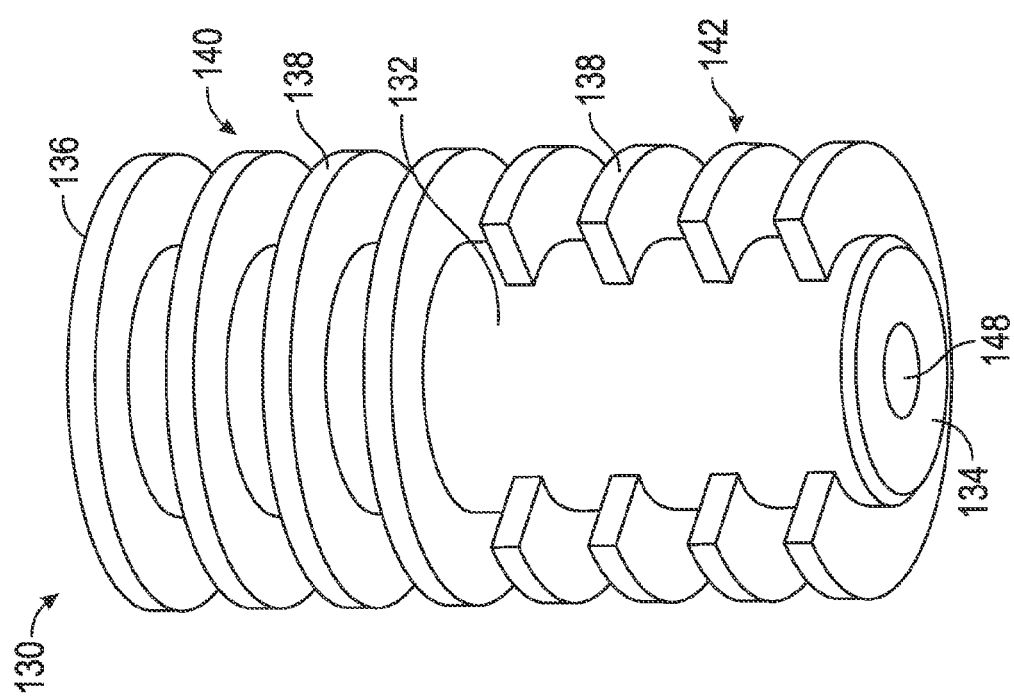
FIG. 5 is a perspective view of a heat sink of a contactor assembly according to an embodiment.
Figure 7:
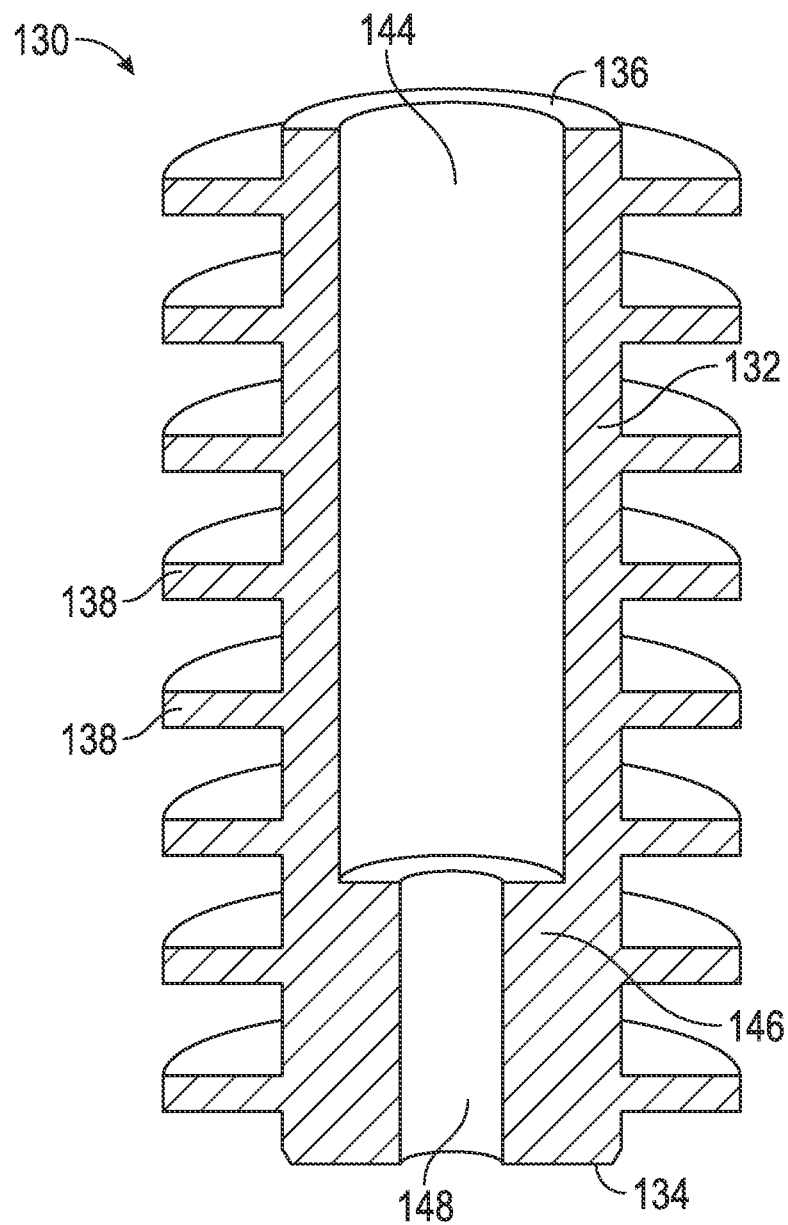
FIG. 7 is a cross-sectional view of a heat sink of a contactor assembly according to an embodiment.

Referring now to FIGS. 5-7, the illustrated heat sinks 130 include a substantially cylindrical body 132 having a plurality of fins 138 extending radially outwardly therefrom. The fins 138 are arranged generally parallel and are generally evenly spaced over the length of the body 132 between a first end 134 and a second, opposite end 136. In one non-limiting embodiment, the fins 138 have a generally rectangular cross-section that remains constant around the circumference of the cylindrical body 132. Fins 138 having a cross-section of another shape, such as triangular or trapezoidal for example, or a cross-section that varies about the periphery of the cylindrical body 132 are also within the scope of the invention.

The plurality of fins 138 extends generally circumferentially (either completely or partially) about the outer diameter of the cylindrical body 132. A first portion 140 of the plurality of fins 138 extends about the entire circumference of the cylindrical body 132, and a second portion 142 of the plurality of fins 138 extends only partially about the circumference of the cylindrical body 132. The second portion 142 of fins 38 may be positioned about the cylindrical body 132 to avoid interference with an adjacent heat sink 130 or other component of the contactor assembly 100. The number of fins 138 within each of the first portion 140 and the second portion 142 may, but need not be, the same. For example, both the first portion 140 and the second portion 142 of the exemplary heat sink 130 illustrated in FIG. 5 include four fins 138. However, the first portion 140 of fins 138 of the exemplary heat sink 130 illustrated in FIG. 6 includes five fins 138 and the second portion 142 includes only one fin 138.

A first end of the cylindrical body is configured to couple to the free end of one of the posts 104, 106. In one embodiment, the cylindrical body 132 has a substantially hollow interior 144 except for an interior portion 146 adjacent the first end 134 (see FIG. 7). The interior portion 146 includes a through hole 148 configured to receive a fastener, such as a screw for example, arranged within the substantially hollow interior 144 of the cylindrical body 132. In another embodiment, a plurality of threads formed into the cylindrical body 132, such as the through hole 148 of the interior portion 146 for example, are configured to mate with a plurality of complementary threads on posts 104, 106.

Referring again to FIG. 4, a heat sink 130 may be mounted to some or each post 104, 106 extending from the contactor 54. In such embodiments, each of the plurality of heat sinks 130 may be substantially identical, or alternatively, may be distinct. The combination of heat sinks 130 used in a contactor assembly 100 is generally determined based on the total amount of heat to be dissipated and the size constraints of the assembly 100. In one embodiment, at least one of the heat sinks 130 coupled to the contactor 54 is similar to the heat sink 130 illustrated in FIG. 5 and at least one of the heat sinks 130 mounted to the contactor 54 is similar to the heat sink 130 illustrated in FIG. 6.

The thermal conductivity of the posts 104, 106 allows heat to conduct from the contactor 54 to the one or more heat sinks 130 coupled thereto. Heat dissipates from the plurality of fins 138 and the cylindrical body 132 into the surrounding air using radiation and convection in the same manner as the heat being dissipated by the bus bars 50. Incorporation of at least one heat sink 130 having multiple fins 138 increases the surface area exposed to the ambient atmosphere. In combination, the heat dissipated by the bus bars 50 and the at least one heat sink 130 results in a higher heat generation tolerance for the contactor 54.

By including at least one heat sink 130, the heat dissipation of the contactor assembly 100 may be improved in a simple, effective manner. In addition, because the contactor assembly 100 efficiently dissipates heat, the bus bars 50 may be reduced to the size required to transfer electrical current to a load.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. An electrical contactor assembly comprising:
   an electrical contactor;
   an electrical bus bar;
   a panel formed from an electrically insulating material;
   one or more posts protruding through the panel and in contact with the electrical bus bar, the one or more posts being constructed from an electrically and thermally conductive material, wherein a first end of each of the one or more posts is configured to electrically and thermally connect to the electrical contactor; and
   a heat sink removably coupled directly to a second end of one of the one or more posts, the heat sink including a body having a plurality of fins stacked axially along the body, wherein in a first portion of the plurality of fins, each fin of the first portion extends around an entire circumference of the body and in a second portion of the plurality of fins, each fin of the second portion extends around only a portion of the circumference of the body.

2. The electrical contactor assembly according to claim 1, wherein the heat sink is threadably coupled to the second end of the one of the one or more posts.

3. The electrical contactor assembly according to claim 2, wherein a first plurality of threads are formed in the heat sink and are configured to mate with a second plurality of threads formed in the second end of the one of the one or more posts.

4. The electrical contactor assembly according to claim 2, wherein the body is substantially cylindrical and includes at least a partially hollow interior.

5. The electrical contactor assembly according to claim 4, wherein a fastener positioned within the at least partially hollow interior of the body couples to the second end of the one of the one or more posts.

6. The electrical contactor assembly according to claim 1, wherein the plurality of fins are substantially parallel to each other and are spaced substantially evenly between a first end of the body and a second end of the body.

7. The electrical contactor assembly according to claim 1, wherein the plurality of fins have a substantially rectangular cross-section.

8. The electrical contactor assembly according to claim 1, wherein the first portion of the plurality of fins and the second portion of the plurality of fins are substantially equal.

9. The electrical contactor assembly according to claim 1, wherein the first portion of the plurality of fins and the second portion of the plurality of fins are substantially different.

10. The electrical contactor assembly according to claim 1, wherein the one or more posts includes a plurality of posts and the heat sink includes a plurality of heat sinks, each of the heat sinks is coupled to a respective one of the second end of each of the plurality of posts.

11. The electrical contactor assembly according to claim 10, wherein the heat sinks coupled to the plurality of posts are substantially identical.

12. The electrical contactor assembly according to claim 10, wherein the heat sinks coupled to the plurality of posts are distinct.

13. An electrical panel box assembly comprising:
- a plurality of electrical contactors;
- a plurality of electrical bus bars;
- a panel formed of an electrically insulating material; and
- a plurality of posts protruding through the panel and in contact with the plurality of electrical bus bars, one or more of the posts being constructed from an electrically and thermally conductive material, wherein a first end of each of the one or more posts is configured to electrically and thermally connect to an electrical contactor of the plurality of electrical contactors; and
- a heat sink removably coupled directly to a second end of one of the one or more of posts, the heat sink including a body having a plurality of fins stacked axially along the body, wherein in a first portion of the plurality of fins, each fin of the first portion extends around an entire circumference of the body and in a second portion of the plurality of fins, each fin of the second portion extends around only a portion of the circumference of the body.

* * * * *